(12) United States Patent
Bangsaruntip et al.

(10) Patent No.: US 8,324,030 B2
(45) Date of Patent: Dec. 4, 2012

(54) NANOWIRE TUNNEL FIELD EFFECT TRANSISTORS

(75) Inventors: Sarunya Bangsaruntip, Mount Kisco, NY (US); Isaac Lauer, Mahopac, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 12/778,315

(22) Filed: May 12, 2010

(65) Prior Publication Data

US 2011/0278546 A1 Nov. 17, 2011

(51) Int. Cl.
*H01L 21/00* (2006.01)

(52) U.S. Cl. .................. 438/151; 257/38; 257/E21.409

(58) Field of Classification Search .................. 257/38, 257/E21.409, E21.471, 296, 368, E6.006; 438/151
See application file for complete search history.

(56) References Cited

U.S. PATENT DOCUMENTS

| | | | |
|---|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,806,141 B2 | 10/2004 | Kamins |
| 6,855,606 B2 | 2/2005 | Chen et al. |
| 6,882,051 B2 | 4/2005 | Majumdar et al. |
| 6,891,227 B2 | 5/2005 | Appenzeller et al. |
| 6,903,013 B2 | 6/2005 | Chan et al. |
| 6,996,147 B2 | 2/2006 | Majumdar et al. |

(Continued)

FOREIGN PATENT DOCUMENTS

EP 217811 A1 4/2010

(Continued)

OTHER PUBLICATIONS

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

(Continued)

*Primary Examiner* — Shaun Campbell
(74) *Attorney, Agent, or Firm* — Cantor Colburn LLP; Vazken Alexanian

(57) ABSTRACT

A method for forming a nanowire tunnel field effect transistor (FET) device includes forming a nanowire suspended by a first pad region and a second pad region, forming a gate around a portion of the nanowire, forming a protective spacer adjacent to sidewalls of the gate structure and around portions of the nanowire extending from the gate structure, implanting ions in a first portion of the exposed nanowire, removing a second portion of the exposed nanowire to form a cavity defined by the core portion of the nanowire surrounded by the gate structure and the spacer, exposing a silicon portion of the substrate, and epitaxially growing a doped semiconductor material in the cavity from exposed cross section of the nanowire, the second pad region, and the exposed silicon portion to connect the exposed cross sections of the nanowire to the second pad region.

14 Claims, 4 Drawing Sheets

U.S. PATENT DOCUMENTS

| | | | |
|---|---|---|---|
| 7,101,762 B2 | 9/2006 | Cohen et al. | |
| 7,151,209 B2 | 12/2006 | Empedocles et al. | |
| 7,180,107 B2 | 2/2007 | Appenzeller et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,449,373 B2 | 11/2008 | Doyle et al. | |
| 7,452,759 B2 | 11/2008 | Sandhu | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,473,943 B2 | 1/2009 | Mostarshed et al. | |
| 7,498,211 B2 | 3/2009 | Ban et al. | |
| 7,550,333 B2 | 6/2009 | Shah et al. | |
| 7,569,941 B2 | 8/2009 | Majumdar et al. | |
| 7,642,578 B2 | 1/2010 | Lee et al. | |
| 7,791,144 B2 | 9/2010 | Chidambarrao et al. | |
| 7,799,657 B2 | 9/2010 | Dao | |
| 7,803,675 B2 | 9/2010 | Suk et al. | |
| 7,834,345 B2 | 11/2010 | Bhuwalka et al. | |
| 7,871,870 B2 | 1/2011 | Mostarshed et al. | |
| 7,893,506 B2 | 2/2011 | Chau et al. | |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 | 12/2005 | Park | |
| 2005/0275010 A1 | 12/2005 | Chen et al. | |
| 2006/0033145 A1 | 2/2006 | Kakoschke et al. | |
| 2007/0001219 A1 | 1/2007 | Radosavljevic et al. | |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0085587 A1 | 4/2008 | Wells et al. | |
| 2008/0121932 A1 | 5/2008 | Ranade | |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenderghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0290418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1 | 3/2009 | Bangsaruntip et al. | |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |
| 2009/0294864 A1 | 12/2009 | Suk et al. | |
| 2010/0193770 A1 | 8/2010 | Bangsaruntip et al. | |
| 2011/0133169 A1* | 6/2011 | Bangsaruntip et al. | 257/38 |

FOREIGN PATENT DOCUMENTS

| | | |
|---|---|---|
| KR | 20090044799 A | 5/2009 |
| WO | 02084757 A1 | 10/2002 |
| WO | WO2008069765 A1 | 6/2008 |

OTHER PUBLICATIONS

Andriotis et al., 'Realistic nanotube-metal contact configuration for molecular electronics applications, IEEE Sensors Journal, vol. 8, No. 6, Jun. 2008.

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008, Jun. 2-4, 2008 pp. 265-268.

Hu et al., 'Fringing field effects on electrical resistivity of semiconductor nanowire-metal contacts', Applied Physics Letters 92, 083503_2008, published online Feb. 27, 2008.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008), published online Mar. 19, 2008.

Leonard et ai., 'Size-dependent effects on electrical contacts to nanotubes and nanowires', Phys Rev Lett., Jul. 14, 2006; 97(2):026804.

M. M. Ziegler et al., "The CMOS/NANO Interface from a Circuits Perspective," ISCASs '03. Proceedings of the 2003 International Symposium on Circuits and Systems, 2003, May 25-28, 2003, Volume: 4, pp. IV-904-IV-907.

M. T. Bjork et al., "Silicon Nanowire Tunneling Field-Effect Transistors," Applied Physics Letters 92, 193504 (2008), published online May 13, 2008.

Ma et al., 'High-performance nanowire complementary metal-semiconductor inverters', Applied Physics Letters 93, 053105_2008, published online Aug. 6, 2008.

Saumitra Raj Mehrotra, 'A Simulation Study of Silicom Nanowire Field Effect Transistors (FETs), University of Cincinnati, Jul. 2007.

Lauhon et al., 'Epitaxial core-shell and core-multishell nanowire heterostructures', Nature, vol. 420, Nov. 7, 2002, pp. 57-61.

Singh et al., 'Si, SiGe Nanowire Devices by Top-Down Technology and Their Applications', IEEE Transactions on Electron Devices, vol. 55, No. 11, Nov. 2008, pp. 3107-3118.

Taichi Su et al., New Planar Self-Aligned Double-Gate Fully Depleted P-MOSFET's Using Epitaxial Lateral Overgrowth (ELO) and Selectively Grown Source/Drain (S/D), Oct. 2000.

N. Checka, 'Circuit Architecture for 3D Integration', Chapter 13 in Wafer Level 3-D ICs Process Technology, ed. C.S. Tan, Springer US, 2008, ISBN 978-0-387-76534-1.

International Search Report; International Application No. PCT/US11/49501; International Filing Date: Aug. 29, 2011; Date of Mailing: Jan. 18, 2012.

International Search Report Written Opinion; International Application No. PCT/US11/49501; International Filing Date: Aug. 29, 2011; Date of Mailing: Jan. 18, 2012.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

* cited by examiner

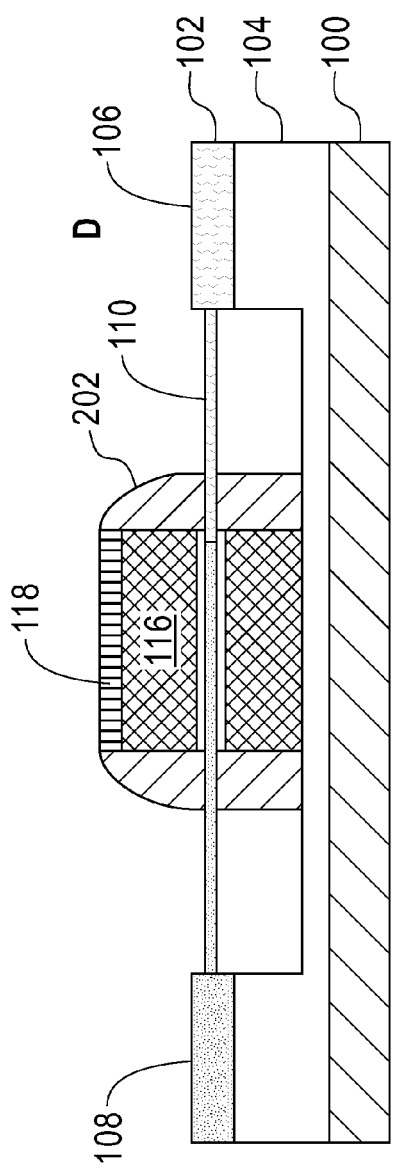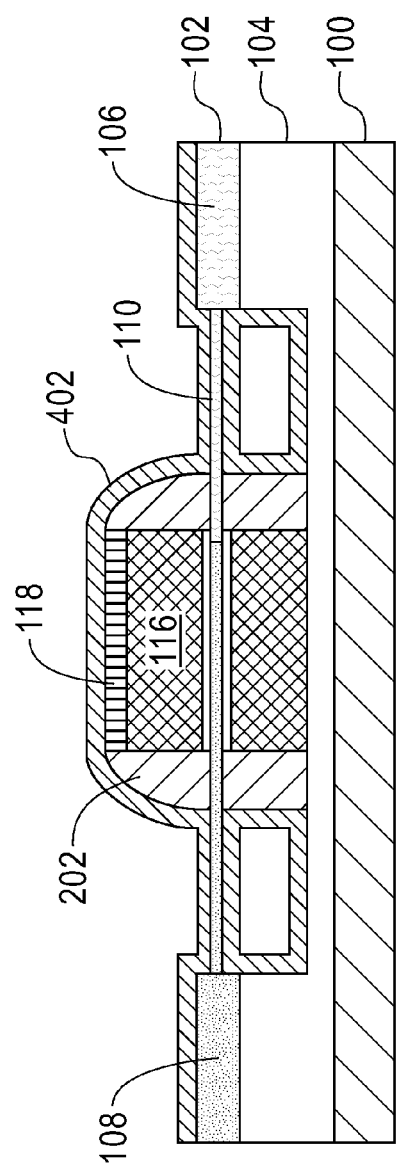

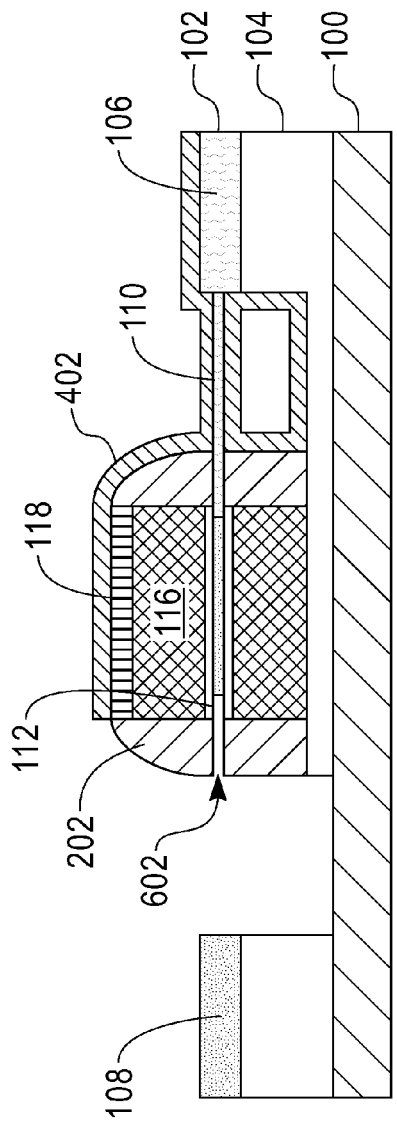
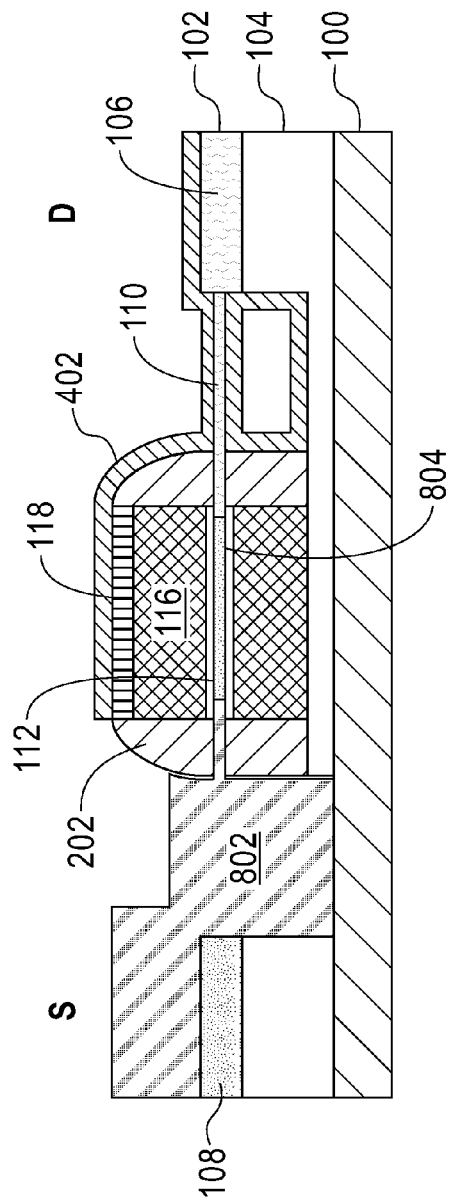

US 8,324,030 B2

NANOWIRE TUNNEL FIELD EFFECT TRANSISTORS

FEDERAL RESEARCH STATEMENT

This invention was made with Government support under Government Contract No.: FA8650-08-C-7806 awarded by Defense Advanced Research Projects Agency (DARPA). The Government has certain rights in this invention.

FIELD OF INVENTION

The present invention relates to semiconductor nanowire tunnel field effect transistors.

DESCRIPTION OF RELATED ART

A nanowire tunnel field effect transistor (FET) includes doped portions of nanowire that contact the channel region and serve as source and drain regions of the device. The source region may include, p-type doped silicon material, while the drain region may include n-type doped silicon material.

BRIEF SUMMARY

In one aspect of the present invention, a method for forming a nanowire tunnel field effect transistor (FET) device includes forming a nanowire suspended by a first pad region and a second pad region over a buried oxide (BOX) portion of a substrate, the nanowire including a core portion and a dielectric layer around the core portion, forming a gate structure around a portion of the dielectric layer, forming a protective spacer adjacent to sidewalls of the gate structure and around portions of the nanowire extending from the gate structure, implanting a first type of ions in a first portion of the exposed nanowire, removing a second portion of the exposed nanowire to form a cavity defined by the core portion of the nanowire surrounded by the gate structure and the spacer, removing a portion of the BOX portion to expose a silicon portion of the substrate between the second pad region and the spacer, and epitaxially growing a doped semiconductor material in the cavity from exposed cross section of the nanowire, the second pad region, and the exposed silicon portion to connect the exposed cross sections of the nanowire to the second pad region.

In another aspect of the present invention, a nanowire tunnel field effect transistor (FET) device includes a channel region including a silicon portion having a first distal end and a second distal end, the silicon portion is surrounded by a gate structure disposed circumferentially around the silicon portion, a drain region including an n-type doped silicon portion extending from the first distal end, a cavity defined by the second distal end of the silicon portion and an inner diameter of the gate structure, and a source region including a doped epi-silicon portion epitaxially extending from the second distal end of the silicon portion in the cavity, a first pad region, and a portion of a silicon substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-8 illustrate an exemplary method for forming a tunnel field effect transistor (FET) device.

DETAILED DESCRIPTION

Figure 1:
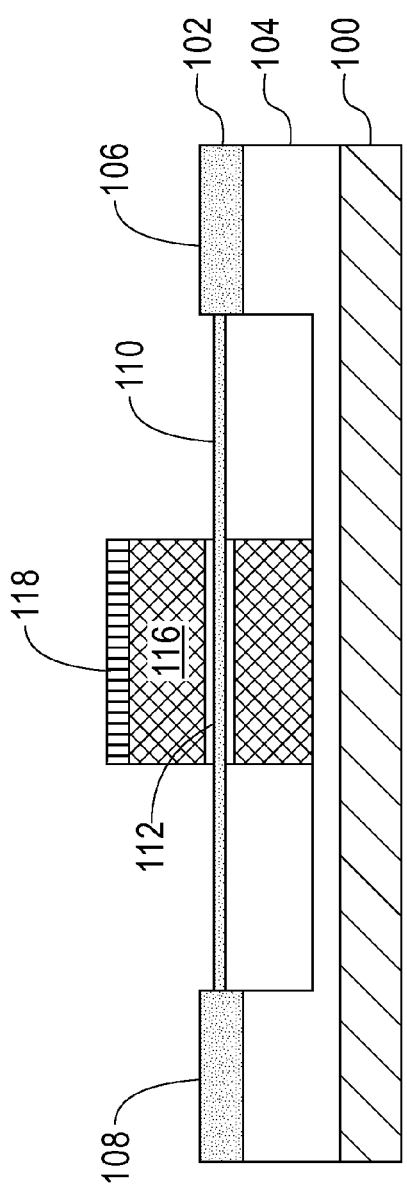

FIGS. 1-8 illustrate a cross-sectional views of a method for forming a FET device. Referring to FIG. 1, a silicon on insulator (SOI) layer 102 is defined on a buried oxide (BOX) layer 104 that is disposed on a silicon substrate 100. The SOI layer 102 includes a SOI pad region 106, a SOI pad region 108, and a silicon nanowire 110. A gate 112 is formed around a portion of the nanowire 110, and capped with a capping layer 116 that may include, for example, a polysilicon material. A hardmask layer 118 such as, for example, silicon nitride ($Si_3N_4$) is formed on the capping layer 116. The gate 112 may include layers of materials (not shown) such as, for example, a first gate dielectric layer (high K layer), such as silicon dioxide ($SiO_2$) around the nanowire 110, a second gate dielectric layer (high K layer) such as hafnium oxide ($HfO_2$) formed around the first gate dielectric layer, and a metal layer such as tantalum nitride (TaN) formed around the second gate dielectric layer.

Figure 2:
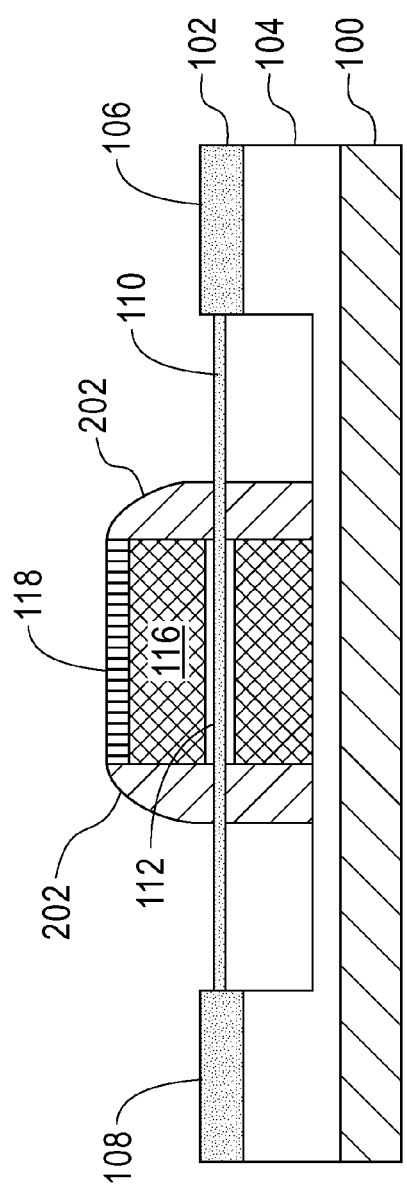

FIG. 2 illustrates spacer portions 202 formed along opposing sides of the capping layer 116. The spacers are formed by depositing a blanket dielectric film such as silicon nitride and etching the dielectric film from all horizontal surfaces by reactive ion etching (RIE). The spacer portions 202 are formed around portions of the nanowire 110 that extend from the capping layer 116 and surround portions of the nanowires 110.

FIG. 3 illustrates the resultant structure following the implantation and activation of n-type ions in the SOI pad region 106 and the adjacent portion of the nanowire 110 that defines a drain region (D). The ions may be implanted by for example, forming a protective mask layer over the SOI pad region 108 and the adjacent nanowire 110 prior to ion implantation. Alternatively, the ions may be implanted at an angle such that the capping layer 116 and spacer 202 may absorb ions and prevent ions from being implanted in an undesired region.

FIG. 4 illustrates the resultant structure following the formation of a conformal hardmask layer 402 over the exposed surfaces of the device. The conformal hardmask layer 402 may include for example, silicon dioxide, silicon nitride, or any other sacrificial material that will inhibit epitaxial growth and may be easily removed.

Figure 5:
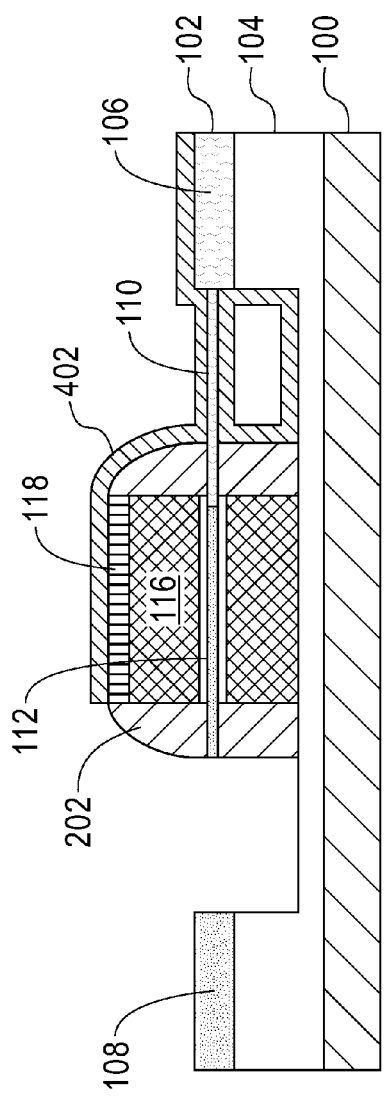

FIG. 5 illustrates the resultant structure following removal of a portion of the nanowire 110 that extended between the SOI pad region 108 and the channel region of the gate 112. The portion of the nanowire 110 may be removed by, for example, patterning and removing a portion of a portion of the conformal hardmask layer 402 and performing an etching process such as, for example, a wet chemical or vapor etching process that etches exposed silicon, and removes the exposed silicon nanowire 110. The portion of the conformal hardmask layer 402 is removed using a process that preserves the conformal hardmask layer 402 in the region that will become the drain region (described below); the removal process is controlled to avoid compromising the integrity of the hardmask layer 118 over the gate 112 and the integrity of the spacer 202.

Figure 6:
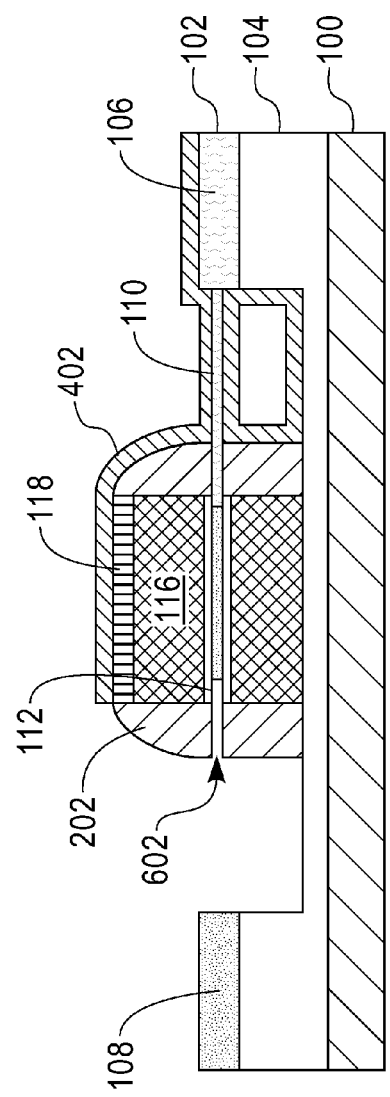

FIG. 6 illustrates the resultant structure following an optional isotropic etching process may be performed to remove a portion of the nanowire 110 that is surrounded by the spacer wall 202 and the gate 112 to recess the nanowire 110 into the gate 112, and form a cavity 602 defined by the gate 112, the nanowire 110 and the spacer wall 202. Alternate embodiments may not include the isotropic etching process that forms the cavity 602. The lateral etching process that forms cavity 602 may be time based. Width variation in spacer 202 may lead to variations in the position of the edges of the recessed nanowire 110. The etching rate in the cavity 602 depends on the size of the cavity, with narrower orifice corresponding to slower etch rates. Variations in the nanowire size will therefore lead to variations in the depth of cavity 602.

FIG. 7 illustrates the resultant structure following the removal of an exposed portion of the BOX layer 104 that exposes a portion of the silicon substrate 100.

FIG. 8 illustrates cross-sectional views of the resultant structures following a selective epitaxial growth of silicon to form a source region (S) 802. The source region 802 is epitaxially grown in the cavity 602 (of FIG. 7) from the exposed nanowire 110 in the gate 112 to form the source region 802. The source region 802 is epitaxially grown from the SOI pad region 108 and the exposed portion of the silicon substrate 100. The source region 802 is formed by epitaxially growing, for example, in-situ doped silicon (Si), a silicon germanium (SiGe), or germanium (Ge) that may be p-type doped. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $B_2H_6$ for p-type doping. Deposition temperatures may range from 550° C. to 1000° C. for pure silicon deposition, and as low as 300° C. for pure Ge deposition.

Once source region (S) 802 is formed, the doping may be activated by, for example, a laser or flash anneal process. The laser or flash annealing may reduce diffusion of ions into the channel region 804 of the gate 112, and result in a high uniform concentration of doping in the source region 802 with an abrupt junction in the nanowires 110.

The hardmask layer 402 and 118 may be removed by, for example, a RIE process. A silicide may be formed on the source region 802 the drain region D and the gate region. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed and a conductive material such as, Al, Au, Cu, or Ag may be deposited to form contacts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a nanowire tunnel field effect transistor (FET) device, the method comprising:
    forming a nanowire suspended by a first pad region and a second pad region over a buried oxide (BOX) portion of a substrate, the nanowire including a core portion and a dielectric layer around the core portion;
    forming a gate structure around a portion of the dielectric layer;
    forming a protective spacer adjacent to sidewalls of the gate structure and around portions of the nanowire extending from the gate structure;
    implanting a first type of ions in a first portion of the exposed nanowire;
    removing a second portion of the exposed nanowire to form a cavity defined by the core portion of the nanowire surrounded by the gate structure and the spacer;
    removing a portion of the BOX portion of the substrate to expose a silicon portion of the substrate between the second pad region and the spacer; and
    epitaxially growing a doped semiconductor material in the cavity from exposed cross section of the nanowire, the second pad region, and the exposed silicon portion of the substrate to connect the exposed cross sections of the nanowire to the second pad region.

2. The method of claim 1, wherein the method includes forming a hardmask layer over exposed surfaces of the device following the implantation of the first type of ions.

3. The method of claim 2, wherein the method includes removing a portion of the hardmask layer to expose the second portion of the nanowire the second pad region, and a portion of the BOX portion between the second pad region and the spacer.

4. The method of claim 1, wherein the core portion of the nanowire includes silicon.

5. The method of claim 1, wherein the dielectric layer includes a first dielectric material formed around the nanowire and a second dielectric material formed around the first dielectric material.

6. The method of claim 1, wherein the first type of ions are n-type ions.

7. The method of claim 1, wherein the first type of ions are implanted at an angle.

8. The method of claim 1, wherein the epitaxially grown doped semiconductor material is silicon.

9. The method of claim 1, wherein the epitaxially grown doped semiconductor material is a SiGe alloy.

10. The method of claim 1, wherein the epitaxially grown doped semiconductor material is Ge.

11. The method of claim 1, wherein the gate structure includes a silicon oxide layer disposed on a channel portion of the nanowire, a dielectric layer disposed on the silicon oxide layer, and a metal layer disposed on the dielectric layer.

12. The method of claim 1, wherein the protective spacer includes a nitride material.

13. The method of claim 1, wherein the epitaxially grown doped semiconductor material is an in-situ doped material.

14. The method of claim 1, wherein the method further comprises heating the device to diffuse dopants from the doped semiconductor material into portions of the nanowire.

* * * * *